United States Patent
Iwasaki et al.

(10) Patent No.: US 10,978,636 B2
(45) Date of Patent: Apr. 13, 2021

(54) MAGNETIC STORAGE DEVICE

(71) Applicant: Toshiba Memory Corporation, Tokyo (JP)

(72) Inventors: Takeshi Iwasaki, Kuwana Mie (JP); Akiyuki Murayama, Koto Tokyo (JP); Tadashi Kai, Yokohama Kanagawa (JP); Tadaomi Daibou, Yokohama Kanagawa (JP); Masaki Endo, Kawasaki Kanagawa (JP); Shumpei Omine, Ota Tokyo (JP); Taichi Igarashi, Kawasaki Kanagawa (JP); Junichi Ito, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 45 days.

(21) Appl. No.: 16/290,481

(22) Filed: Mar. 1, 2019

(65) Prior Publication Data

US 2020/0083431 A1 Mar. 12, 2020

(30) Foreign Application Priority Data

Sep. 6, 2018 (JP) .............................. JP2018-167220

(51) Int. Cl.
| | |
|---|---|
| *H01L 43/02* | (2006.01) |
| *H01L 43/10* | (2006.01) |
| *H01L 27/22* | (2006.01) |
| *H01L 43/12* | (2006.01) |
| *G11C 11/16* | (2006.01) |

(52) U.S. Cl.
CPC ............ *H01L 43/02* (2013.01); *G11C 11/161* (2013.01); *H01L 27/224* (2013.01); *H01L 27/228* (2013.01); *H01L 43/10* (2013.01); *H01L 43/12* (2013.01); *G11C 11/165* (2013.01)

(58) Field of Classification Search
None
See application file for complete search history.

(56) References Cited

U.S. PATENT DOCUMENTS

| | | | |
|---|---|---|---|
| 8,184,408 B2 | 5/2012 | Murakami et al. | |
| 9,177,574 B2 | 11/2015 | Fuji et al. | |
| 10,090,456 B2 * | 10/2018 | Huai | ................... H01F 10/3286 |
| 2013/0028013 A1 | 1/2013 | Ikeda et al. | |
| 2014/0063656 A1 * | 3/2014 | Hashimoto | ............ G11B 5/667 360/110 |

(Continued)

FOREIGN PATENT DOCUMENTS

| | | |
|---|---|---|
| JP | 4244312 B2 | 3/2009 |
| JP | 2011155073 A | 8/2011 |

(Continued)

*Primary Examiner* — Mounir S Amer
(74) *Attorney, Agent, or Firm* — Kim & Stewart LLP

(57) ABSTRACT

According to one embodiment, a storage device includes a magnetoresistive effect element comprising a nonmagnetic layer and a stacked body on the nonmagnetic layer. The stacked body includes a first ferromagnetic layer on the nonmagnetic layer, a second ferromagnetic layer exchange-coupled with the first ferromagnetic layer, and a magnetic layer between the first ferromagnetic layer and the second ferromagnetic layer. The magnetic layer includes a magnetic material and at least one compound selected from among a carbide, a nitride, and a boride.

20 Claims, 10 Drawing Sheets

(56) References Cited

U.S. PATENT DOCUMENTS

| | | | | |
|---|---|---|---|---|
| 2014/0329112 A1* | 11/2014 | Aizawa | ............. | G11B 5/73 |
| | | | | 428/831.2 |
| 2017/0098761 A1* | 4/2017 | Worledge | ............. | H01L 43/08 |
| 2018/0067429 A1* | 3/2018 | Kikuchi | ............. | G03G 15/2057 |
| 2018/0269382 A1 | 9/2018 | Omine et al. | | |
| 2019/0013043 A1* | 1/2019 | Nakashio | ............. | G11B 5/656 |

FOREIGN PATENT DOCUMENTS

| | | |
|---|---|---|
| JP | 5150284 B2 | 2/2013 |
| JP | 5518896 32 | 6/2014 |
| JP | 2018157033 A | 10/2018 |

* cited by examiner

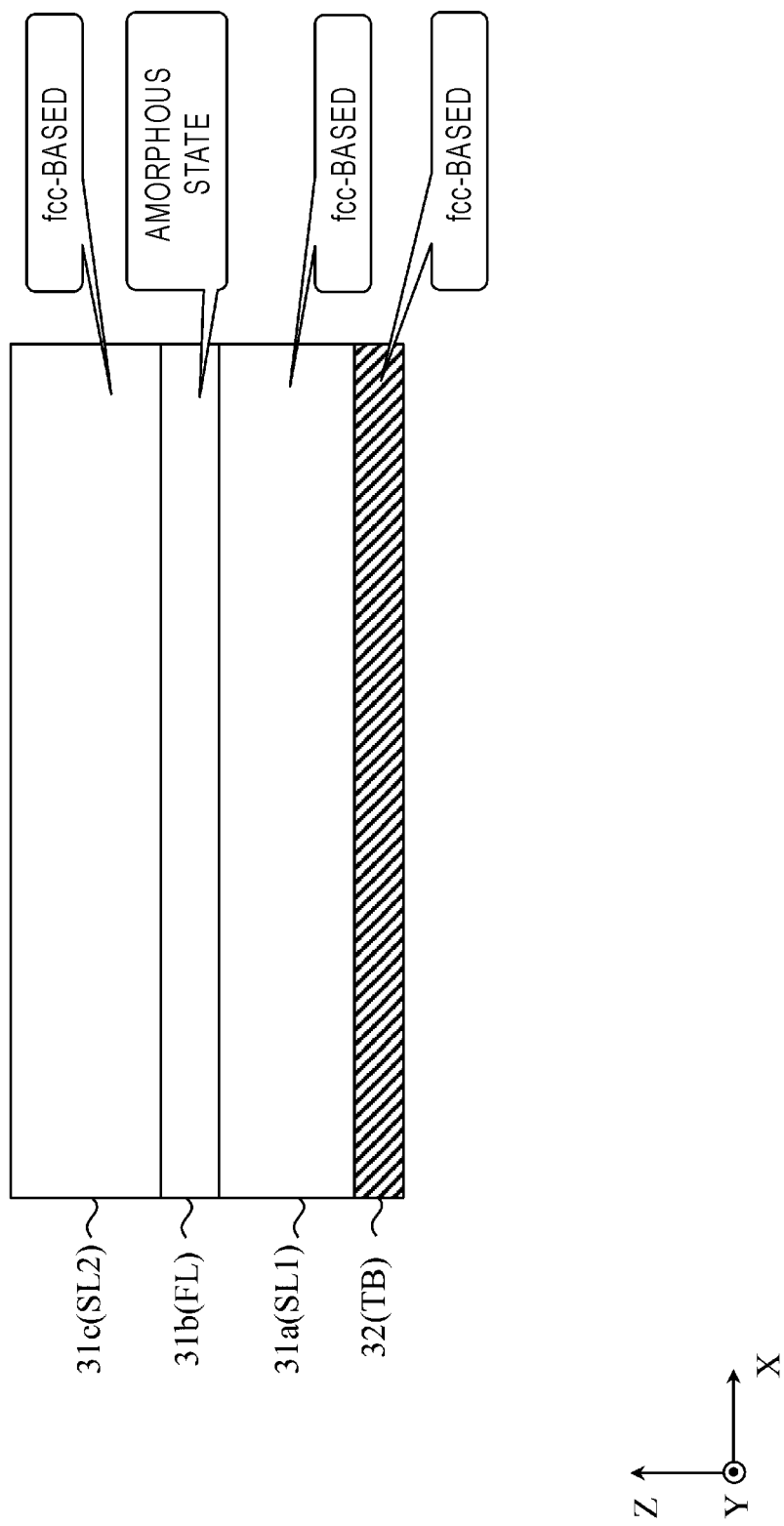

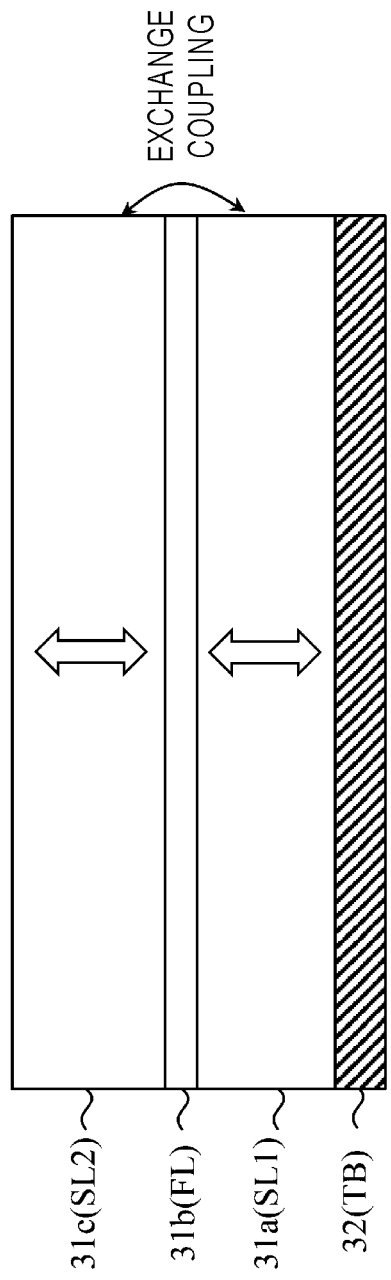
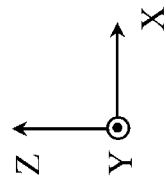

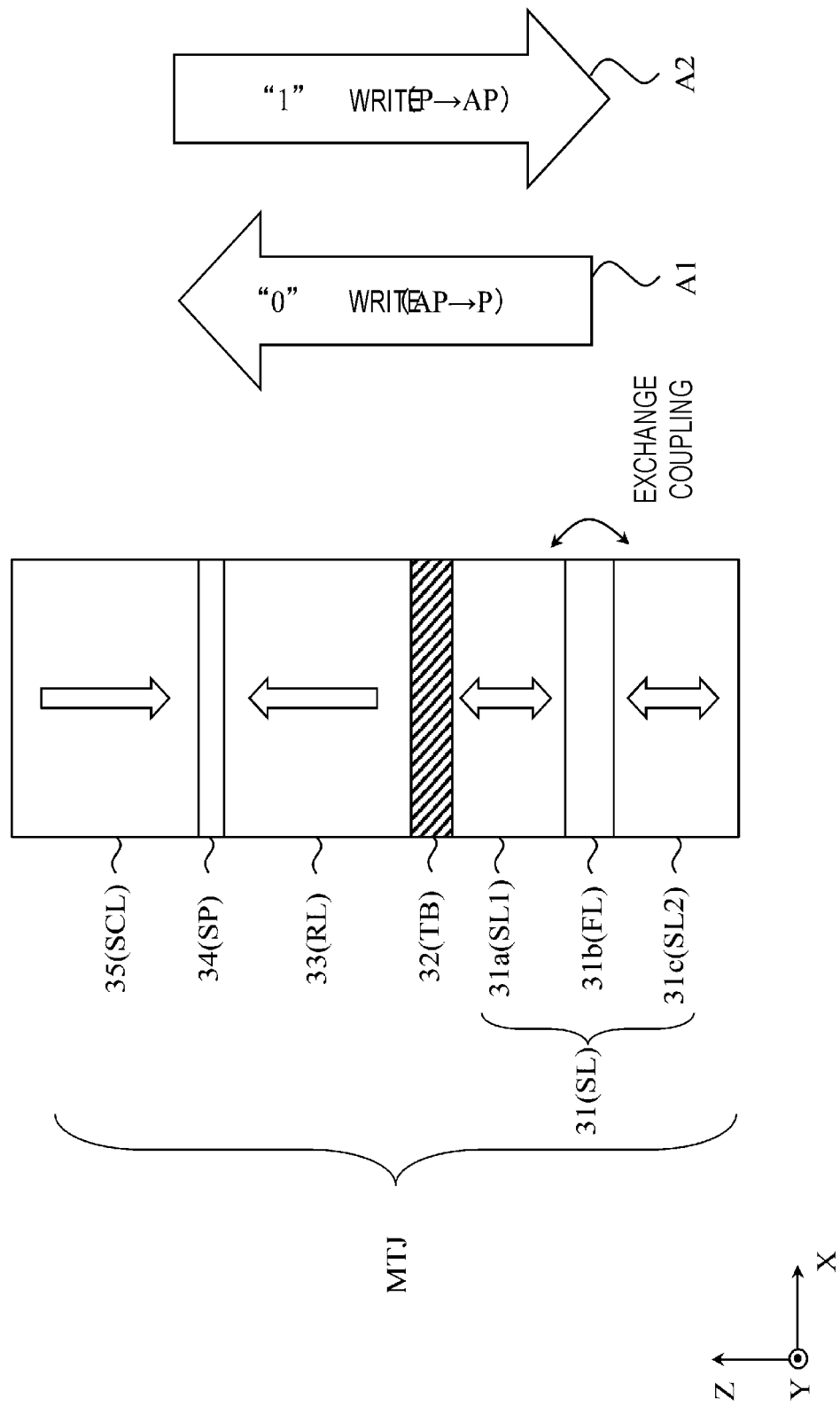

MAGNETIC STORAGE DEVICE

CROSS-REFERENCE TO RELATED APPLICATIONS

This application is based upon and claims the benefit of priority from Japanese Patent Application No. 2018-167220, filed Sep. 6, 2018, the entire contents of which are incorporated herein by reference.

FIELD

Embodiments described herein relate generally to a magnetic storage device.

BACKGROUND

A magnetic storage device, such as magnetoresistive random access memory (MRAM), using a magnetoresistive effect element as a storage element is known.

DESCRIPTION OF THE DRAWINGS

FIG. 7 is a schematic view illustrating aspects of a method of manufacturing a magnetoresistive effect element of a magnetic storage device according to the first embodiment.

FIG. 8 is a schematic view illustrating aspects of a method of manufacturing a magnetoresistive effect element of a magnetic storage device according to the first embodiment.

FIG. 9 is a cross-sectional view of a magnetoresistive effect element of a magnetic storage device according to a first modification.

DETAILED DESCRIPTION

Figure 1:
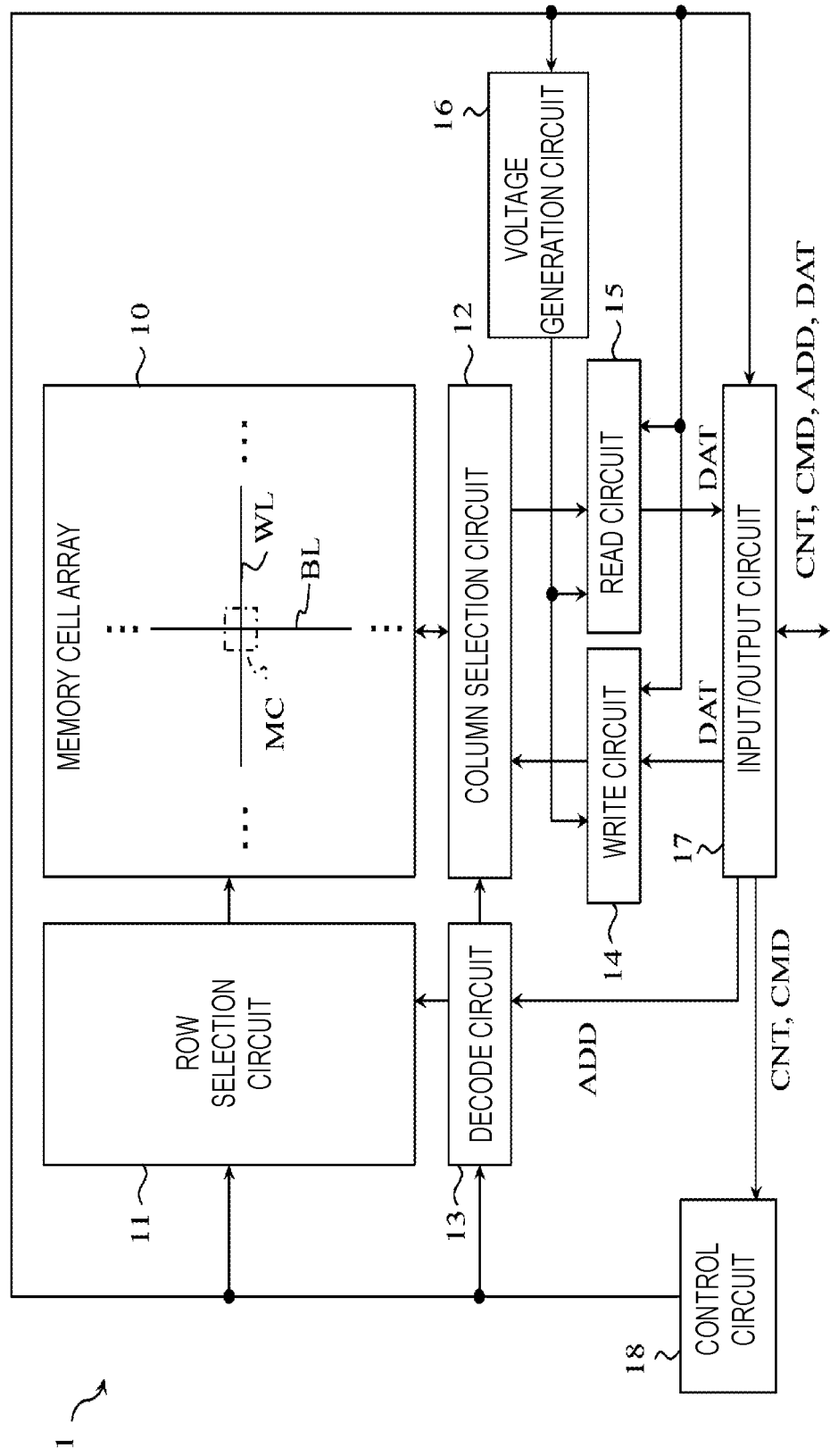
FIG. 1 is a block diagram illustrating a magnetic storage device according to a first embodiment.

Embodiments provide a magnetic storage device having an improved resistance change rate and retention property.

In general, according to one embodiment, a storage device, for example, a magnetic storage device, includes a magnetoresistive effect element comprising a nonmagnetic layer and a stacked body disposed on the nonmagnetic layer. The stacked body includes a first ferromagnetic layer on the nonmagnetic layer, a second ferromagnetic layer exchange-coupled with the first ferromagnetic layer, and a magnetic layer between the first ferromagnetic layer and the second ferromagnetic layer. The magnetic layer includes a magnetic material and at least one compound selected from among a carbide, a nitride, and a boride.

Hereinafter, example embodiments will be described with reference to the drawings. In the following description, the same reference numerals will be given to elements and aspects having the same functions and/or configurations. In addition, when distinguishing different instances from among a plurality of elements having the same reference numeral, the reference numeral will be appended with a suffix to distinguish among the different instances of the plurality of elements. When distinction is not particularly required amongst a plurality of elements, then only the reference numeral with no suffix attached may be utilized. Suffixes are not limited to subscripts and superscripts, but may include, for example, lowercase alphabetical letters and indexes indicating arrangement.

1. First Embodiment

A magnetic storage device according to a first embodiment will be described. The magnetic storage device according to the first embodiment is, for example, a magnetic storage device based on perpendicular magnetization, which uses a magnetic tunnel junction (MTJ) element as a storage element.

1.1 Configuration

First, a configuration of the magnetic storage device according to the first embodiment will be described.

1.1.1 Configuration of Magnetic Storage Device

FIG. 1 is a block diagram illustrating a configuration of the magnetic storage device according to the first embodiment. As illustrated in FIG. 1, the magnetic storage device 1 includes a memory cell array 10, a row selection circuit 11, a column selection circuit 12, a decode circuit 13, a write circuit 14, a read circuit 15, a voltage generation circuit 16, an input/output circuit 17, and a control circuit 18.

The memory cell array 10 includes a plurality of memory cells MC each associated with a row and a column. The memory cells MC in the same row are connected to the same word line WL, and the memory cells MC in the same column are connected to the same bit line BL.

The row selection circuit 11 is connected to the memory cell array 10 via the word lines WL. The decoded result of an address ADD (row address) from the decode circuit 13 is supplied to the row selection circuit 11. The row selection circuit 11 sets word lines WL which corresponds to the decode result a selected state. Hereinafter, a word line WL set to the selected state is referred to as a selected word line WL. In addition, word lines WL other than a selected word line WL is referred to as a non-selected word line WL.

The column selection circuit 12 is connected to the memory cell array 10 via the bit lines BL. The decode result of the address ADD (column address) from the decode circuit 13 is supplied to the column selection circuit 12. The column selection circuit 12 sets the bit lines BL based on the decode result of the address ADD to a selected state. Hereinafter, a bit line BL set to the selected state is referred to as a selected bit line BL. In addition, a bit line BL other than the selected bit line BL is referred to as a non-selected bit line BL.

The decode circuit 13 decodes the address ADD from the input/output circuit 17. The decode circuit 13 supplies the decoded address ADD to the row selection circuit 11 and the column selection circuit 12. The address ADD includes the selected column address and row address.

The write circuit 14 writes data to the memory cell MC. The write circuit 14 includes, for example, a write driver.

The read circuit 15 reads data from the memory cell MC. The read circuit 15 includes, for example, a sense amplifier.

The voltage generation circuit 16 generates voltages for various operations of the memory cell array 10 by using a power supply voltage provided from outside of the magnetic storage device 1. For example, the voltage generation circuit 16 generates the various voltages required for a write operation and outputs these voltages to the write circuit 14. In addition, for example, the voltage generation circuit 16 generates the various voltages required for a read operation and outputs these voltages to the read circuit 15.

The input/output circuit 17 transfers the address ADD received from outside of the magnetic storage device 1 to the decode circuit 13. The input/output circuit 17 transfers a command CMD from the outside to the control circuit 18. The input/output circuit 17 transmits and receives various control signals CNT between the outside and the control circuit 18. The input/output circuit 17 transfers data DAT from the outside to the write circuit 14 and outputs the data DAT transferred from the read circuit 15 to the outside.

The control circuit 18 controls operations of the row selection circuit 11, the column selection circuit 12, the decode circuit 13, the write circuit 14, the read circuit 15, the voltage generation circuit 16, and the input/output circuit 17 based on the control signals CNT and the commands CMD.

1.1.2 Configuration of Memory Cell Array

Figure 2:
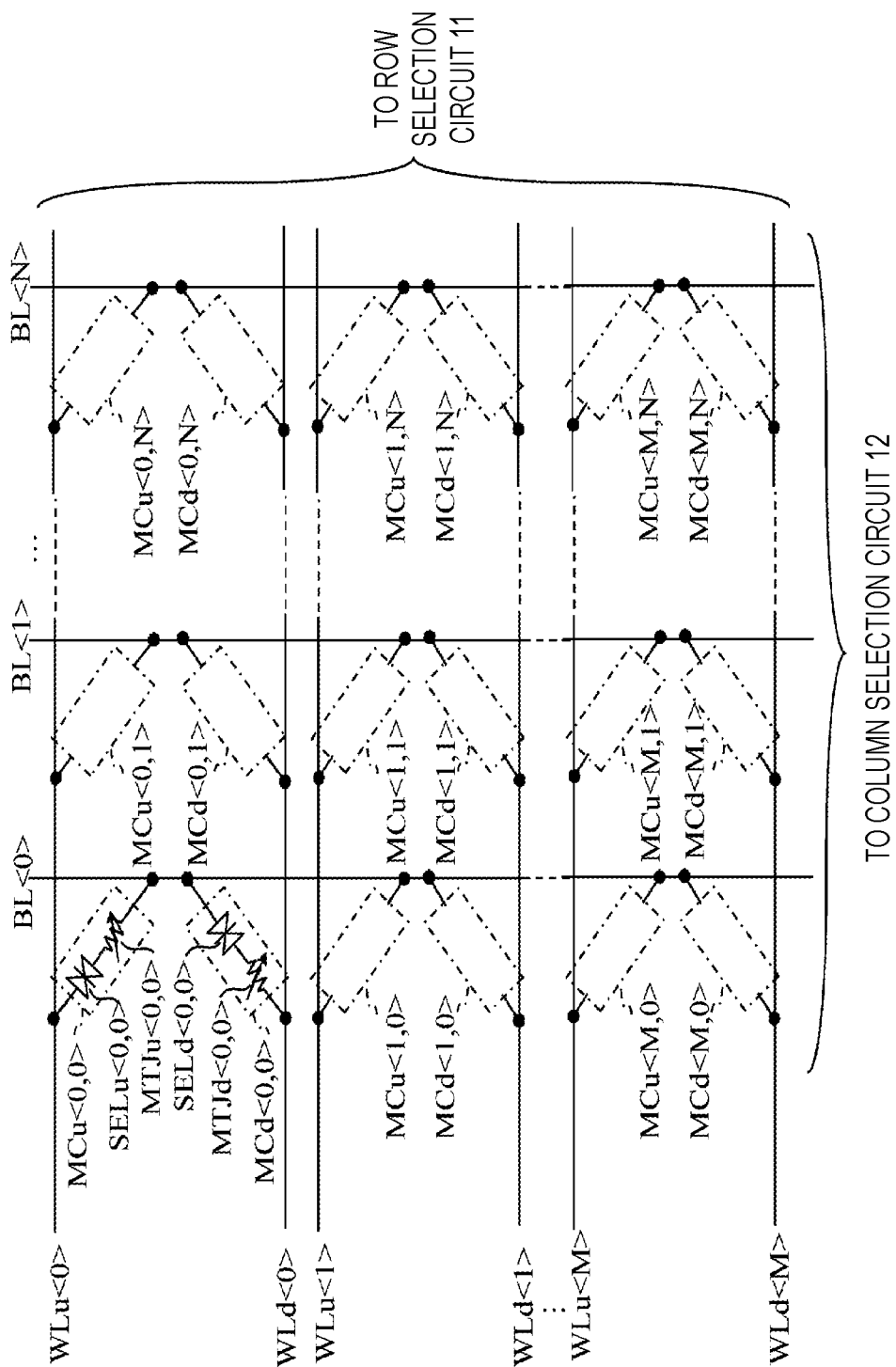
FIG. 2 is a circuit diagram of a memory cell array of a magnetic storage device according to the first embodiment.

FIG. 2 is a circuit diagram illustrating a configuration of the memory cell array of the magnetic storage device according to the first embodiment. In FIG. 2, the several word lines WL are further classified and distinguished by suffixes "u" and "d" and an index values "<0>" to "<M>".

As illustrated in FIG. 2, the memory cells MC (memory cells MCu and memory cells MCd) are arranged in a matrix in the memory cell array 10 and are respectively associated with one set consisting of one bit line BL from the plurality of bit lines (BL<0>, BL<1> . . . BL<N>) and one word line WLd (WLd<0>, WLd<1> . . . WLd<M>) or one word line WLu (WLu<0>, WLu<1> . . . WLu<M>) (where M and N are integers). That is, memory cell MCd<i, j> ($0 \leq i \leq M$, $0 \leq j \leq N$) is connected to the word line WLd<i> and the bit line BL<j>, and the memory cell MCu<i, j> is connected to the word line WLu<i> and to the bit line BL<j>.

The suffixes "d" and "u" are utilized for convenient identification of those components provided below the bit line BL and those provided above the bit line BL, respectively. An example of a three-dimensional structure of the memory cell array 10 will be described later.

The memory cell MCd<i, j> includes a selector SELd<i, j> and a magnetoresistive effect element MTJd<i, j> connected to each other in series. The memory cell MCu<i, j> includes a selector SELu<i, j> and a magnetoresistive effect element MTJu<i, j> connected to each other in series.

The selector SEL functions as a switch that controls the supply of current to the magnetoresistive effect element MTJ at the time of writing and reading data to and from the magnetoresistive effect element MTJ. More specifically, the selector SEL serves as an insulator, having a large resistance value, that interrupts (turns off) current when a voltage applied to the corresponding memory cell MC is below a threshold voltage Vth and serves as a conductor, having a small resistance value, that allows flow of (turns on) current when the voltage exceeds the threshold voltage Vth. That is, the selector SEL is switchable to interrupt or allow flow of current according to the magnitude of the voltage applied to the memory cell MC, regardless of the direction of the flowing current.

The selector SEL may be, for example, a switching element between two terminals. When a voltage applied between the two terminals is equal to or less than the threshold voltage, the switching element is in a "high resistance" state, for example, an electrically nonconductive state. When the voltage applied between the two terminals is equal to or greater than the threshold, the switching element changes to a "low resistance" state, for example, an electrically conductive state. The switching element may have this function with either polarity of the voltage. For example, the switching element may include at least one chalcogen element selected from the group consisting of tellurium (Te), selenium (Se), and sulfur (S). Alternatively, the switching element may include a chalcogenide, a compound including the chalcogen element. In addition to this, the switching element may include at least one element selected from the group consisting of boron (B), aluminum (Al), gallium (Ge), indium (In), carbon (C), silicon (Si), germanium (Ge), tin (Sn), arsenic (As), phosphorus (P), and antimony (Sb).

The magnetoresistive effect element MTJ may switch a resistance value between the low resistance state and the high resistance state by the current controlled and supplied by the selector SEL. The magnetoresistive effect element MTJ functions as a storage element capable of storing data according to a change in the resistance state thereof, holding the written data in a nonvolatile manner, and permitting the reading of the stored data.

Figure 3:
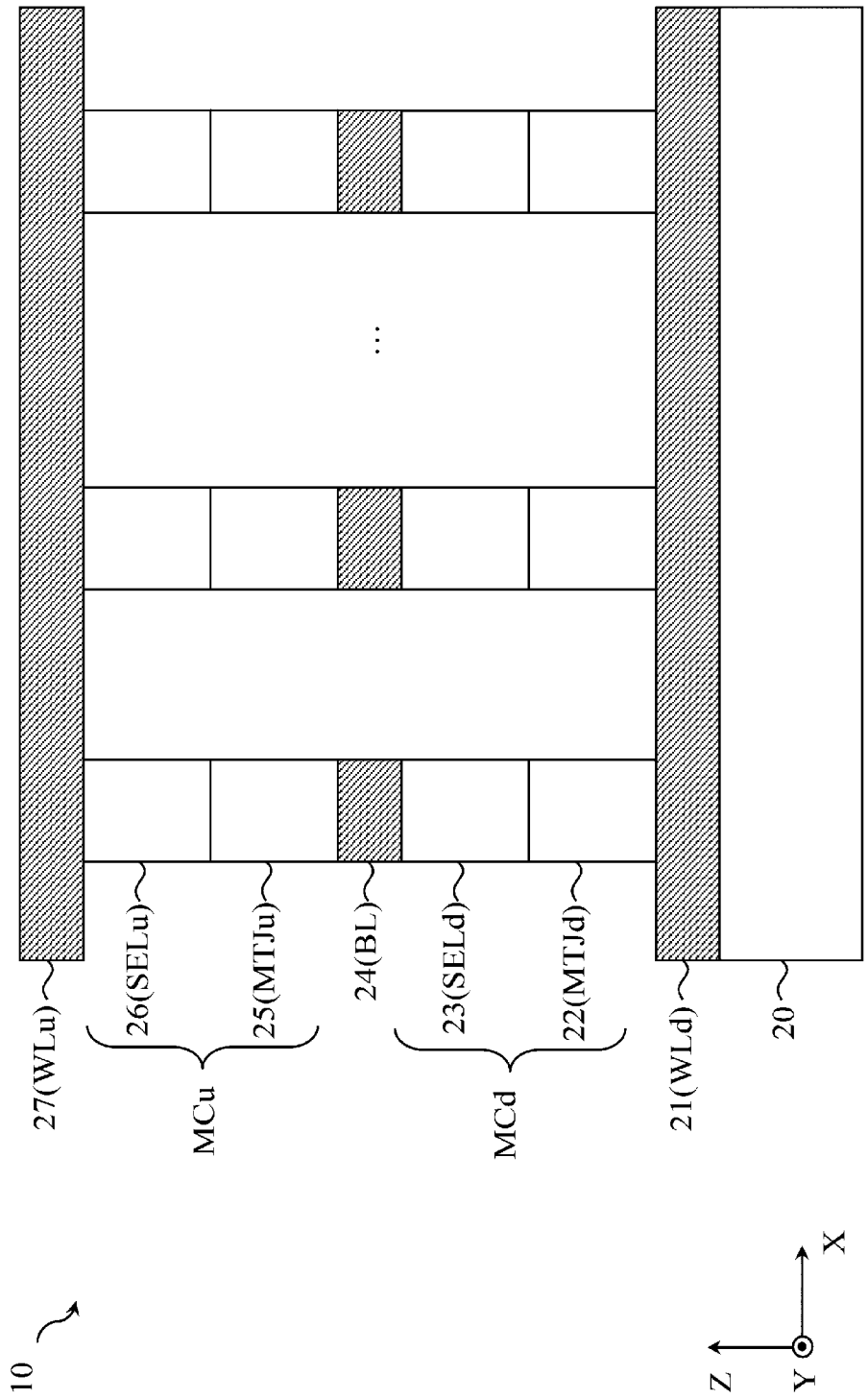
FIG. 3 is a cross-sectional view of a memory cell array of a magnetic storage device according to the first embodiment.

Next, a cross-sectional structure of the memory cell array 10 will be described with reference to FIG. 3. FIG. 3 illustrates an example of a cross-sectional structure, taken along the word line, of the memory cell array of the magnetic storage device according to the first embodiment.

As illustrated in FIG. 3, the magnetic storage device 1 is provided on a semiconductor substrate 20. In the following description, a plane parallel to the surface of the semiconductor substrate 20 is set as the XY plane and a direction perpendicular to the XY plane is set as the Z direction. In addition, the direction along the word line WL is set as the X direction, and the direction along the bit line BL is set as the Y direction.

For example, a plurality of conductors 21 functioning as the word lines WLd are provided on the upper surface of the semiconductor substrate 20. These conductors 21 are, for example, provided side by side in the Y direction and extend respectively in the X direction. In FIG. 3, just one of the conductors 21 is illustrated. A plurality of elements 22, functioning as magnetoresistive effect elements MTJd, are, for example, provided side by side in the X direction on the upper surface of this one conductor 21. That is, the plurality of elements 22 (MTJd) provided side by side in the X direction are connected in common to one conductor 21. An element 23, functioning as a selector SELd, is provided on the upper surface of each of the elements 22. A conductor 24, functioning as a bit line BL, is provided on the upper surface of each of the elements 23. The conductors 24 are, for example, provided side by side in the X direction and extend respectively in the Y direction. That is, a plurality of elements 23 provided side by side in the Y direction are connected in common to one conductor 24.

Elements 25, functioning as the magnetoresistive effect elements MTJu, are provided on the upper surface of each of the conductors 24. That is, a plurality of elements 25 provided side by side in the Y direction are connected in common to one conductor 24. Each element 25 has, for example, the same functional configuration as the elements 22. An element 26, functioning as the selector SELu, is provided on the upper surface of each of the elements 25.

Each element 26 has, for example, the same functional configuration as the elements 23. A conductor 27, functioning as a word line WLu, is connected in common to the upper surface of each of the elements 26 provided side by side in the X direction. A plurality of such conductors 27 are provided side by side in the Y direction. The conductors 27 extend, for example, in the X direction, respectively.

With the above configuration, the memory cell array 10 has a structure in which each memory cell MCd is provided between a word line WLd and a bit line BL, and each memory cell MCu is provided between a bit line BL and a word line WLu. Thus, a pair of memory cells MCd and MCu share a bit line BL in common, but are connected to different respective word lines. That is, each memory cell MCd is connected to a word line WLd, and each memory cell MCu is connected to a word line WLu. In the structure illustrated in FIG. 3, the memory cells MCd are in a lower layer and the memory cells MCu are in an upper layer. That is, the memory cell MC provided in a layer above the bit line BL corresponds to a memory cell MCu and the memory cell MC provided in a layer below the bit line BL corresponds to a memory cell MCd.

In addition, in the example of FIG. 3, the conductor 21, the elements 22 and 23, the conductor 24, the elements 25 and 26, and the conductor 27 are illustrated as being in contact with each other, but the configuration is not limited thereto, and other elements (or layers) may be interposed between these respective components.

1.1.3 Configuration of Magnetoresistive Effect Element

Figure 4:
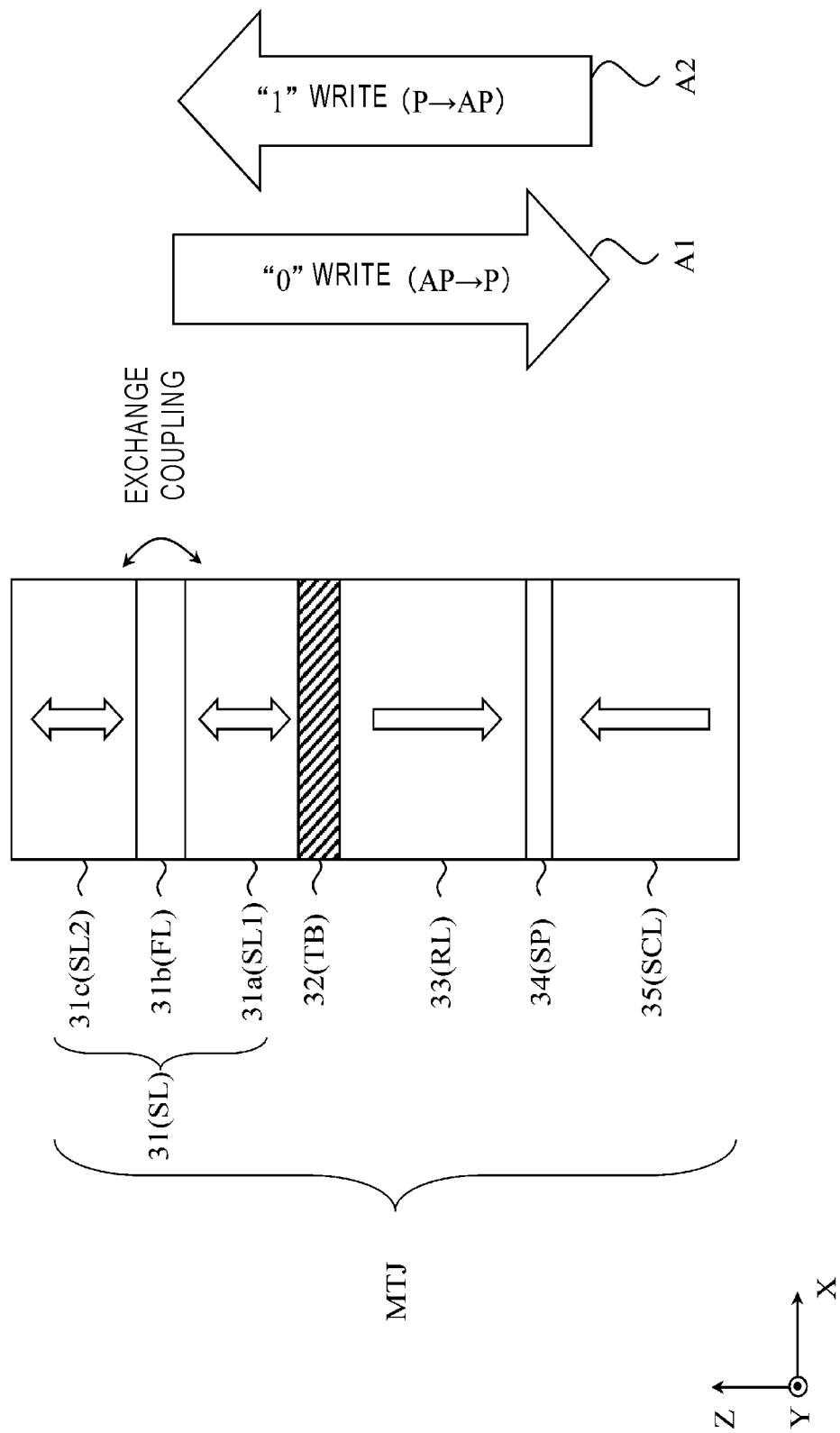
FIG. 4 is a cross-sectional view of a magnetoresistive effect element of a magnetic storage device according to the first embodiment.

FIG. 4 is a cross-sectional view illustrating a configuration of the magnetoresistive effect element of the magnetic storage device according to the first embodiment. FIG. 4 illustrates an example of a cross section, taken along a vertical plane (e.g., the XZ plane) of a magnetoresistive effect element MTJ (e.g., an element 22 or element 25) illustrated in FIG. 3.

As illustrated in FIG. 4, the elements 22 and 25 each includes a stacked body 31, functioning as a storage layer SL, a nonmagnetic material 32, functioning as a tunnel barrier layer TB, a ferromagnetic material 33, functioning as a reference layer RL, a nonmagnetic material 34, functioning as a spacer layer SP, and a ferromagnetic material 35, functioning as a shift canceling layer SCL.

For example, the element 22 is formed by stacking a plurality of materials in this order: the ferromagnetic material 35, the nonmagnetic material 34, the ferromagnetic material 33, the nonmagnetic material 32, and the stacked body 31 from the word line WLd side to the bit line BL side (in the Z axis direction). For example, the element 25 is formed by stacking a plurality of materials in this order: the ferromagnetic material 35, the nonmagnetic material 34, the ferromagnetic material 33, the nonmagnetic material 32, and the stacked body 31 from the bit line BL side to the word line WLu side (in the Z axis direction). For example, the elements 22 and 25 function as MTJ elements of a perpendicular magnetization type in which the magnetization directions of the magnetic materials constituting the elements 22 and 25 are perpendicular to the film surface.

The stacked body 31 includes a ferromagnetic material $31a$, functioning as an interface storage layer SL1, a soft magnetic material $31b$, functioning as a function layer FL, and a ferromagnetic material $31c$, functioning as a layer SL2 that is exchange-coupled with the interface storage layer SL1. In the stacked body 31, the ferromagnetic material $31a$, the soft magnetic material $31b$, and the ferromagnetic material $31c$ are stacked in this order on the nonmagnetic material 32.

The ferromagnetic material $31a$ exhibits ferromagnetism and has an easy magnetization axis direction in a direction perpendicular to the film surface. The ferromagnetic material $31a$ has a magnetization direction oriented to either the bit line BL side or the word line WL side. The ferromagnetic material $31a$ includes, for example, cobalt iron boron (CoFeB) or iron boride (FeB) and may have a body-centered cubic (bcc) type crystal structure.

The soft magnetic material $31b$ exhibits soft magnetism and has the same magnetization direction as the ferromagnetic material $31a$ due to magnetic coupling with the ferromagnetic material $31a$. The soft magnetic material $31b$ has an amorphous structure and bonds the ferromagnetic material $31a$ and the ferromagnetic material $31c$, which have different crystal structures to each other, while separating the ferromagnetic material $31a$ from the ferromagnetic material $31c$ crystallographically. In addition, the soft magnetic material $31b$ has a function of maintaining exchange-coupling between the ferromagnetic material $31a$ and the ferromagnetic material $31c$, for example, by self magnetism thereof. In addition, the soft magnetic material $31b$ may have high conductivity.

As a material satisfying the above-described requirements, for example, the soft magnetic material $31b$ includes an element having magnetism (i.e., a magnetic element) and an additive. More specifically, for example, from the viewpoint of having magnetism, the soft magnetic material $31b$ includes at least one element selected from among cobalt (Co) and nickel (Ni) as the magnetic element. In addition, the soft magnetic material $31b$ includes at least one additional element selected from among titanium (Ti), zirconium (Zr), hafnium (Hf), vanadium (V), niobium (Nb), and tantalum (Ta). When one of these elements is incorporated in the magnetic material, the Curie temperature may be lowered. On the other hand, the soft magnetic material $31b$ preferably does not lose soft magnetism even when exposed to a high temperature environment (e.g., 300° C. to 400° C.). Thus, the soft magnetic material $31b$ is preferably selected from among materials having a Curie temperature of at least 600 K or more. From this viewpoint, any additive to the soft magnetic material $31b$ preferably includes at least one of nitrogen (N), carbon (C), or boron (B). More specifically, the soft magnetic material $31b$ preferably includes, as an additive, at least one compound selected from among titanium nitride (TiN), zirconium nitride (ZrN), titanium carbide (TiC), zirconium carbide (ZrC), niobium carbide (NbC), tantalum carbide (TaC), titanium boride (TiB$_2$), and zirconium boride (ZrB$_2$).

In some instances, it may be difficult for the additive and the magnetic element to be mixed with each other in the soft magnetic material $31b$. Specifically, this may be the case when the additive has a large negative standard Gibbs Free energy of formation (e.g., $\Delta_f G° = -250$ kJ·mol$^{-1}$ or less). However, it is possible to prevent a reduction in the Curie temperature while realizing an amorphous property. Thus, the soft magnetic material $31b$ may separate the crystal structures of the ferromagnetic materials $31a$ and $31c$ from each other and may promote the crystallization of the ferromagnetic material $31a$.

In addition, the above-mentioned additive may have a relatively low electrical resistivity (e.g., 50 μΩcm or less). Therefore, a decrease in the write current may be prevented by use of relatively small amounts of additive, and data may be written to the magnetoresistive effect element MTJ with less current.

In addition, when the amount of additive is increased in order to promote amorphization, the proportion of the magnetic element included in the soft magnetic material 31b may be reduced and the soft magnetic material 31b may lose magnetism. Therefore, the proportion of the additive which can be in the soft magnetic material 31b may be limited so that the soft magnetic material 31b does not lose magnetism. Specifically, for example, the additive included in the soft magnetic material 31b may be included at a concentration within a range of, for example, 5 mol % to 50 mol %.

The ferromagnetic material 31c has ferromagnetism and an easy magnetization axis direction in a direction perpendicular to the film surface. The ferromagnetic material 31c may have the same magnetization direction as the ferromagnetic material 31a by exchange-coupling with the ferromagnetic material 31a via the soft magnetic material 31b. Therefore, with the exchange-coupling between the ferromagnetic material 31a and the ferromagnetic material 31c, the stacked body 31 is increased in magnetization as a single body and hardly changes with respect to external disturbance such as, for example, heat or an external magnetic field. The ferromagnetic material 31c may be configured with, for example, an artificial lattice including a nonmagnetic noble metal element and a magnetic element, and may have, for example, a face-centered cubic (fcc) type crystal structure. A noble metal element includes, for example, silver (Ag), gold (Au), palladium (Pd), platinum (Pt), nickel (Ni), ruthenium (Ru), and rhodium (Rh). In addition, the magnetic element includes, for example, at least one element selected from among cobalt (Co), iron (Fe), manganese (Mn), and nickel (Ni). More specifically, the ferromagnetic material 31c may include an artificial lattice configured with, for example, a multilayer film of cobalt (Co) and platinum (Pt) (Co/Pt multilayer film), a multilayer film of cobalt (Co) and palladium (Pd) (Co/Pd multilayer film), a multilayer film of cobalt chrome (CoCr) and platinum (Pt) (CoCr/Pt multilayer film), a multilayer film of cobalt (Co) and ruthenium (Ru) (Co/Ru multilayer film), a multilayer film of cobalt (Co) and osmium (Os) (Co/Os multilayer film), a multilayer film of cobalt (Co) and gold (Au) (Co/Au multilayer film), and a multilayer film of nickel (Ni) and copper (Cu) (Ni/Cu multilayer film). The ferromagnetic material 31c may adjust, for example, the density of magnetic anisotropic energy and saturation magnetization, and may obtain high perpendicular magnetic anisotropy by adding the magnetic element into the artificial lattice and by adjusting the ratio of the thicknesses of a magnetic element layer and a nonmagnetic element layer.

The nonmagnetic material 32 is a nonmagnetic insulating film, and includes, for example, magnesium oxide (MgO). The nonmagnetic material 32 is provided between the ferromagnetic material 31a and the ferromagnetic material 33, and is a magnetic tunnel junction between these two ferromagnetic materials.

The ferromagnetic material 33 has ferromagnetism and an easy magnetization axis direction in a direction perpendicular to the film surface. The ferromagnetic material 33 has a magnetization direction oriented to either the bit line BL side or the word line WL side. The ferromagnetic material 33 includes, for example, cobalt iron boron (CoFeB) or iron boride (FeB). The magnetization direction of the ferromagnetic material 33 is fixed and, in the example of FIG. 4, is oriented to the ferromagnetic material 35. Here, "the magnetization direction is fixed" means that the magnetization direction does not change due to current (spin torque) having a magnitude capable of reversing the magnetization direction of the exchange-coupled ferromagnetic materials 31a and 31c.

In addition, although not specifically illustrated in FIG. 4, the ferromagnetic material 33 may be a stacked body including a plurality of layers. Specifically, for example, the ferromagnetic material 33 may have a stacked body structure in which a ferromagnetic material layer is stacked on the surface of a layer including cobalt iron boron (CoFeB) or iron boride (FeB) with a nonmagnetic conductor interposed therebetween. The nonmagnetic conductor in the stacked body constituting the ferromagnetic material 33 may include, for example, at least one metal selected from among tantalum (Ta), hafnium (Hf), tungsten (W), zirconium (Zr), molybdenum (Mo), niobium (Nb), and titanium (Ti). The ferromagnetic material layer in the stacked body constituting the ferromagnetic material 33 may include, for example, at least one artificial lattice selected from among a multilayer film of cobalt (Co) and platinum (Pt) (Co/Pt multilayer film), a multilayer film of cobalt (Co) and nickel (Ni) (Co/Ni multilayer film), and a multilayer film of cobalt (Co) and palladium (Pd) (Co/Pd multilayer film).

The nonmagnetic material 34 is a nonmagnetic conductive film, and includes, for example, at least one element selected from among ruthenium (Ru), osmium (Os), iridium (Ir), vanadium (V), and chromium (Cr).

The ferromagnetic material 35 has ferromagnetism and an easy magnetization axis direction in a direction perpendicular to the film surface. The ferromagnetic material 35 includes, for example, at least one alloy selected from among cobalt platinum (CoPt), cobalt nickel (CoNi), and cobalt palladium (CoPd). The ferromagnetic material 35 may be a stacked body including a plurality of layers, similarly to the ferromagnetic material 33. In this case, the ferromagnetic material 35 may include, for example, at least one artificial lattice selected from among a multilayer film of cobalt (Co) and platinum (Pt) (Co/Pt multilayer film), a multilayer film of cobalt (Co) and nickel (Ni) (Co/Ni multilayer film), and a multilayer film of cobalt (Co) and palladium (Pd) (Co/Pd multilayer film).

The ferromagnetic material 35 has a magnetization direction oriented to either the bit line BL side or the word line WL side. The magnetization direction of the ferromagnetic material 35 is fixed and, in the example of FIG. 4, is oriented to the ferromagnetic material 33.

The ferromagnetic materials 33 and 35 are antiferromagnetically coupled by the nonmagnetic material 34. That is, the ferromagnetic materials 33 and 35 are coupled so as to have anti-parallel magnetization directions. Therefore, in the example of FIG. 4, the magnetization direction of the ferromagnetic material 33 is oriented to the ferromagnetic material 35. Such a coupling structure of the ferromagnetic material 33, the nonmagnetic material 34, and the ferromagnetic material 35 is called a synthetic anti-ferromagnetic (SAF) structure. Therefore, the ferromagnetic material 35 may cancel out the influence of a leaked magnetic field of the ferromagnetic material 33 on the magnetization direction of the ferromagnetic material 31a. Therefore, the ferromagnetic materials 31a and 31c are prevented from developing asymmetry in reversal of magnetization (that is, differences in the ease of reversal of the magnetization direction from one direction and the other direction) due to an external factor caused by, for example, the leaked magnetic field of the ferromagnetic material 33.

The first embodiment adopts a spin injection write method of directly applying write current to a magnetoresistive effect element MTJ, injecting a spin torque into the storage layer SL and the reference layer RL by the write current, and controlling the magnetization direction of the storage layer SL and the magnetization direction of the reference layer RL. The magnetoresistive effect element MTJ may take either the low resistance state or the high resistance state according to whether a relationship of the magnetization directions of the storage layer SL and the reference layer RL is parallel or anti-parallel.

When a write current Iw0 having a certain magnitude is applied to the magnetoresistive effect element MTJ in the direction of the arrow A1 in FIG. 4, that is, in the direction from the storage layer SL to the reference layer RL, the relative relationship of the magnetization directions of the storage layer SL and the reference layer RL are parallel. In this parallel state, the resistance value of the magnetoresistive effect element MTJ is the lowest and the magnetoresistive effect element MTJ is set to the low resistance state. This low resistance state is called a "parallel (P) state" and is defined as, for example, a binary data value "0."

In addition, when write current Iw1 greater than the write current Iw0 is applied to the magnetoresistive effect element MTJ in the direction of the arrow A2 in FIG. 4, that is, in the direction from the storage layer SL to the reference layer RL (the same direction as the arrow A1), the relationship of the magnetization directions of the storage layer SL and the reference layer RL are anti-parallel. In this anti-parallel state, the resistance value of the magnetoresistive effect element MTJ is the highest and the magnetoresistive effect element MTJ is set to the high resistance state. This high resistance state is called an "anti-parallel (AP) state" and is defined as, for example, a binary data value "1."

In the following description, the above-described method of specifying data values will be utilized, but the method of specifying data value "1" and data value "0" is not limited to the above example. For example, the P state may be defined as data value "1" and the AP state may be defined as data value "0."

1.2 Manufacturing Method

FIGS. 5 to 8 are schematic views illustrating aspects of a method of manufacturing a magnetoresistive effect element of a magnetic storage device according to the first embodiment. In FIGS. 5 to 8, in order to simplify description, from among the various layers constituting the magnetoresistive effect element MTJ, only the ferromagnetic material 31a, the soft magnetic material 31b, the ferromagnetic material 31c, and the nonmagnetic material 32 are illustrated and the other layers are omitted.

Figure 5:
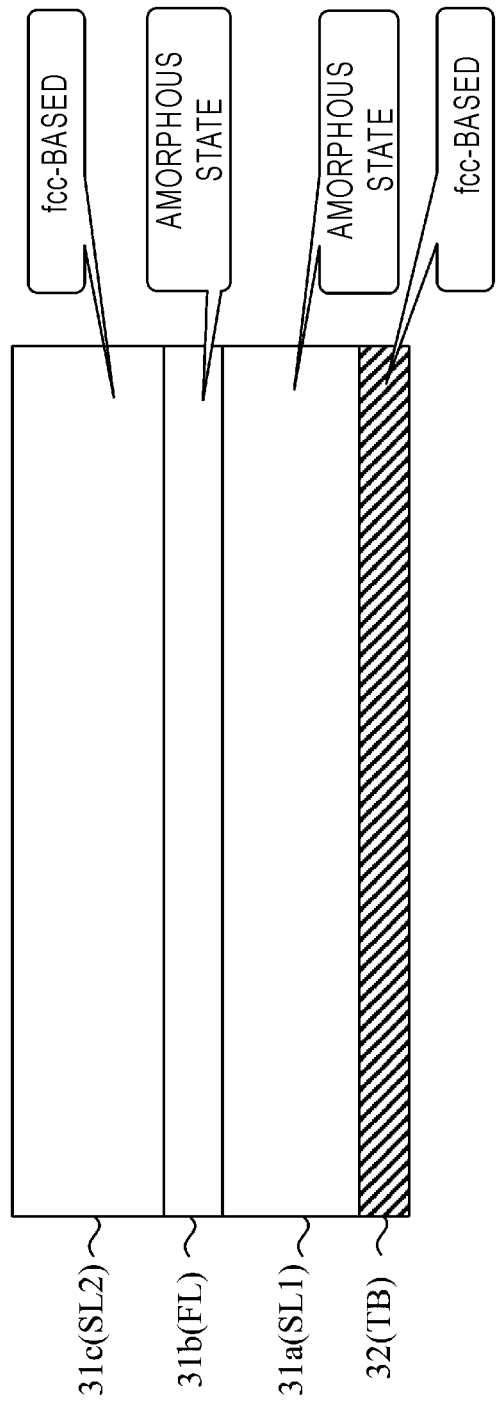
FIG. 5 is a schematic view illustrating aspects of a method of manufacturing a magnetoresistive effect element of a magnetic storage device according to the first embodiment.
Figure 6:
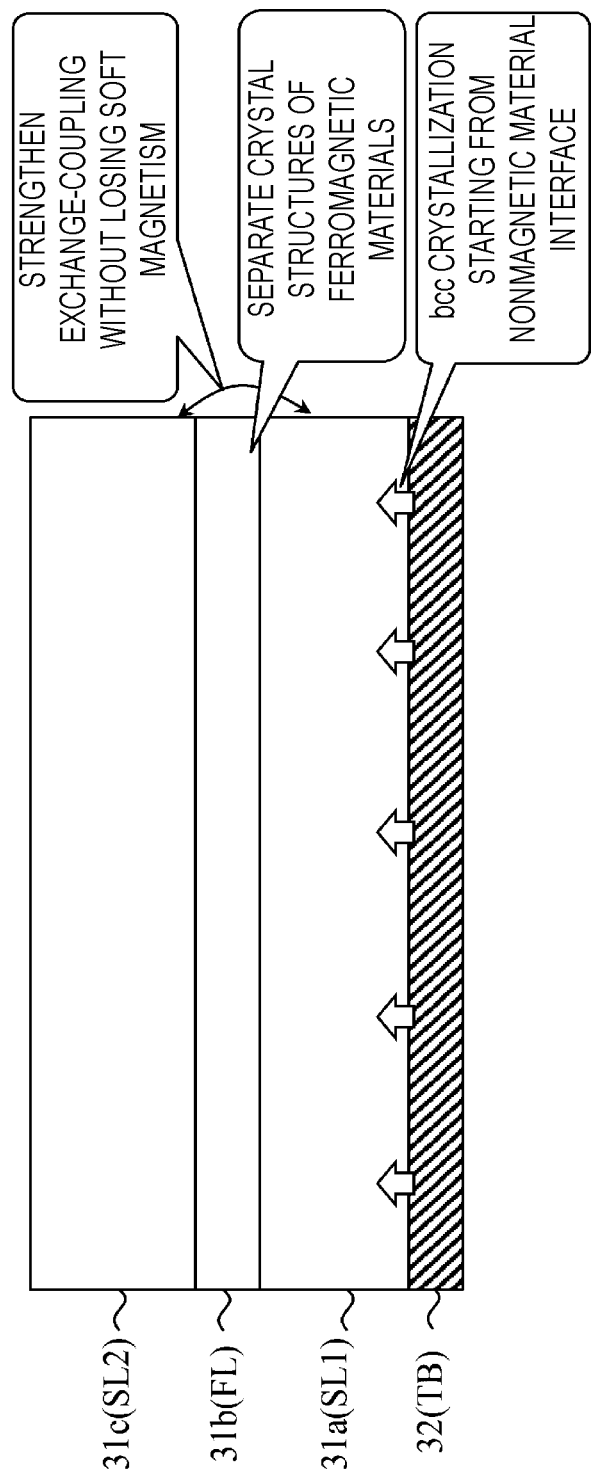
FIG. 6 is a schematic view illustrating aspects of a method of manufacturing a magnetoresistive effect element of a magnetic storage device according to the first embodiment.

FIG. 5 illustrates a state before an annealing processing is performed but after various materials, which are to function as the tunnel barrier layer TB and the storage layer SL, have been stacked. FIG. 6 illustrates a state during the annealing process. FIG. 7 illustrates a state after the annealing process is completed. FIG. 8 illustrates a state in which the function of the storage layer SL is provided by a magnetization processing after the state depicted in FIG. 7. Hereinafter, each state of FIGS. 5 to 8 will be described in order.

As illustrated in FIG. 5, the nonmagnetic material 32, the ferromagnetic material 31a, the soft magnetic material 31b, and the ferromagnetic material 31c are stacked in this order. The nonmagnetic material 32 is stacked having a bcc-based crystal structure. The ferromagnetic material 31a and the soft magnetic material 31b are stacked in an amorphous state, and the ferromagnetic material 31c is stacked having an fcc-based crystal structure. Portions of the stacked layers are removed or etched using, for example, ion beams, except for those portions which are to function as the magnetoresistive effect element MTJ.

Next, as illustrated in FIG. 6, an annealing processing is performed the stacked layers depicted in FIG. 5. Specifically, heat (e.g., within a range from 300° C. to 400° C.) is applied from the outside for a predetermined period, whereby the ferromagnetic material 31a is converted from the amorphous state to a crystalline state. Here, the nonmagnetic material 32 can serve to control the orientation of the crystal structure of the ferromagnetic material 31a. In other words, the ferromagnetic material 31a can grow (via solid-phase epitaxy) a crystal structure with the nonmagnetic material 32 as a seed. As a result, the lattice spacing in the crystal plane of the ferromagnetic body 31a equals the lattice spacing in the crystal plane of the non-magnetic body 32, and therefore the ferromagnetic body 31a has a bcc crystal structure. Here, such a relationship as between the ferromagnetic body 31a and the non-magnetic body 32 is referred to as having a "same structure."

In addition, as described above, the soft magnetic material 31b includes an additive having a standard Gibbs Free energy of formation which is negative and has a large absolute value. Therefore, the additive is prevented from being well mixed with the magnetic element in the soft magnetic material 31b, and the amorphous property of the soft magnetic material 31b is maintained. Therefore, the soft magnetic material 31b in the amorphous state prevents the ferromagnetic material 31a from being crystallized from the ferromagnetic material 31c side during the annealing processing described above. Therefore, the soft magnetic material 31b may crystallographically separate the ferromagnetic material 31a having a bcc-based crystal structure from the ferromagnetic material 31c having an fcc-based crystal structure.

In addition, as described above, the soft magnetic material 31b includes at least one compound selected from among a nitride, a carbide, and a boride. Therefore, the soft magnetic material 31b may be designed to have the Curie temperature higher than the temperature applied during annealing. Therefore, the ferromagnetic material 31c may strengthen the exchange-coupling between the ferromagnetic material 31a and the ferromagnetic material 31c without losing soft magnetism due to annealing.

Next, as illustrated in FIG. 7, the annealing processing in FIG. 6 terminates. As described above, the soft magnetic material 31b prevents the bcc-based crystallization of the ferromagnetic material 31a from being obstructed by the ferromagnetic material 31c having an fcc-based crystal structure. Therefore, the ferromagnetic material 31a may obtain various properties such as, for example, interfacial magnetic anisotropy for functioning as the storage layer SL.

Next, as illustrated in FIG. 8, a magnetization processing is performed on each layer on which the annealing processing is completed in FIG. 7. Specifically, when a magnetic field having a magnitude capable of magnetizing the ferromagnetic material 31a exchange-coupled with the ferromagnetic material 31c is applied to each layer from the outside in a predetermined direction, the ferromagnetic materials 31a and 31c are magnetized. Along with this, the soft magnetic material 31b is magnetized in the same magnetization direction as the ferromagnetic materials 31a and 31c. Therefore, the ferromagnetic material 31a, the soft magnetic material 31b, and the ferromagnetic material 31c are capable of functioning, collectively, as the storage layer SL.

In this way, the manufacture of the magnetoresistive effect element MTJ terminates.

1.3 Effects according to Present Embodiment

According to the first embodiment, the storage layer SL is configured with the stacked body 31 including the ferromagnetic material 31a and the ferromagnetic material 31c. Therefore, the ferromagnetic material 31a may increase the magnetization volume of the entire stacked body 31 by exchange-coupling with the ferromagnetic material 31c. Therefore, in the stacked body 31, the magnetization direction of the ferromagnetic material 31a is difficult to reverse by an external disturbance such as, for example, heat or an external magnetic field, and retention is improved.

In addition, there is a possibility of the ferromagnetic material 31c obstructing the bcc-type crystallization of the ferromagnetic material 31a since it has an fcc-type crystal structure. In the first embodiment, the stacked body 31 is provided with the soft magnetic material 31b having an amorphous structure between the ferromagnetic material 31a and the ferromagnetic material 31c. Specifically, the soft magnetic material 31b includes at least one magnetic element selected from among cobalt (Co) and nickel (Ni). Therefore, even when the film thickness of the soft magnetic material 31b is increased, the soft magnetic material 31b may maintain the exchange-coupling of the ferromagnetic materials 31a and 31c by magnetism thereof. Therefore, it is possible to reduce the influence of the ferromagnetic material 31c on the crystallization of the ferromagnetic material 31a, and to crystallize the ferromagnetic material 31a with good quality. Therefore, it is possible to improve the perpendicular magnetic anisotropy of the ferromagnetic material 31a, and to improve the resistance change ratio of the magnetoresistive effect element MTJ.

In addition to the magnetic element described above, the soft magnetic material 31b may further include at least one compound selected from among titanium nitride (TiN), zirconium nitride (ZrN), titanium carbide (TiC), zirconium carbide (ZrC), niobium carbide (NbC), tantalum carbide (TaC), titanium boride (TiB2), and zirconium boride (ZrB2). The compound is selected to have negative standard generation energy having a large absolute value. Therefore, since the compound is hard to mix with the magnetic element, the soft magnetic material 31b easily maintains the amorphous state and a reduction in the Curie temperature is prevented. Therefore, it is possible to prevent the soft magnetic material 31b from being crystallized and losing soft magnetism at the time of annealing. Thus, it is possible to further prevent the inhibition of crystallization of the ferromagnetic material 31a and deterioration in the exchange-coupling between the ferromagnetic materials 31a and 31c.

In addition, since the soft magnetic material 31b has magnetism, the exchange-coupling between the ferromagnetic materials 31a and 31c is maintained even if the film thickness of the soft magnetic material 31b is increased. Therefore, it is possible to design the film thickness to be thicker than when a nonmagnetic functional layer is applied. Therefore, it is possible to further reduce the influence of the ferromagnetic material 31c on the crystallization of the ferromagnetic material 31a, and moreover, to enhance the perpendicular magnetic anisotropy of the ferromagnetic material 31a.

In addition, the soft magnetic material 31b includes a compound having a molar concentration of 5 mol % to 50 mol %. Therefore, the soft magnetic material 31b may maintain the amorphous property thereof and may be prevented from losing magnetism.

In addition, the additive included in the soft magnetic material 31b includes at least one compound selected from among nitrogen (N), carbon (C), and boron (B). Therefore, it is possible to obtain higher conductivity than when an oxygen (O) compound is included as the additive. Therefore, it is possible to prevent an increase in the resistance value of the magnetoresistive effect element MTJ, and moreover, to prevent an increase in the write current.

2. Modification

Although the magnetoresistive effect element MTJ of the first embodiment has been described as being of a top-free type in which the storage layer SL is provided above the reference layer RL, the magnetoresistive effect element MTJ may be of a bottom-free type in which the storage layer SL is provided below the reference layer RL.

FIG. 9 is a cross-sectional view illustrating a configuration of the magnetoresistive effect element of the magnetic storage device according to a first modification. FIG. 9 illustrates a configuration of a bottom-free-type magnetoresistive effect element MTJ rather than the top-free-type magnetoresistive effect element MTJ described with reference to FIG. 4.

As illustrated in FIG. 9, the element 22 is formed by stacking a plurality of materials in the order: the stacked body 31, the nonmagnetic material 32, the ferromagnetic material 33, the nonmagnetic material 34, and the ferromagnetic material 35 in the direction from the word line WLd side to the bit line BL side (in the Z axis direction). For example, the element 25 is formed by stacking a plurality of materials in the order: the stacked body 31, the nonmagnetic material 32, the ferromagnetic material 33, the nonmagnetic material 34, and the ferromagnetic material 35 in the direction from the bit line BL side to the word line WLu side (in the Z axis direction). In addition, for example, the stacked body 31 is formed by stacking the ferromagnetic material 31c, the soft magnetic material 31b, and the ferromagnetic material 31a in this order in the Z axis direction, and the nonmagnetic material 32 is provided on the upper surface of the ferromagnetic material 31a.

Materials equivalent to those of the first embodiment are used as the ferromagnetic material 31a, the soft magnetic material 31b, the ferromagnetic material 31c, the nonmagnetic material 32, the ferromagnetic material 33, the nonmagnetic material 34, and the ferromagnetic material 35. With the above configuration, it is possible to achieve the same effect as in the first embodiment using a bottom-free type design.

In addition, in the memory cell MC described in the first embodiment and the first modification, a case where the selector SEL has been described as a switching element between two terminals, but a metal oxide semiconductor (MOS) transistor may instead be utilized as the selector SEL.

In any event, the memory cell array 10 is not to be considered limited to the above-mentioned embodiment and first modification, and any array structure may be applied thereto.

Figure 10:
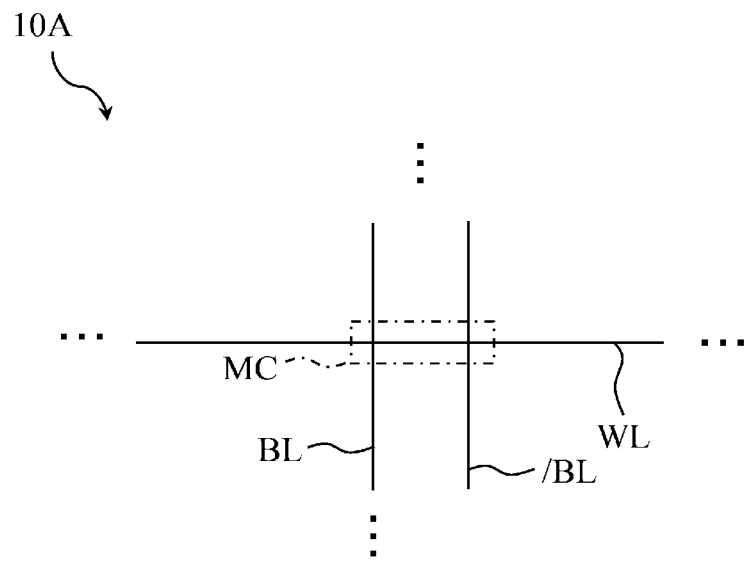
FIG. 10 is a circuit diagram of a memory cell array of a magnetic storage device according to a second modification.

FIG. 10 is a circuit diagram illustrating a configuration of a memory cell array of a magnetic storage device according to a second modification. FIG. 10 corresponds, in general, to the memory cell array 10 in the magnetic storage device 1 of the first embodiment described with reference to FIG. 1.

As illustrated in FIG. 10, the memory cell array 10A includes a plurality of memory cells MC, each of which is associated with a row and a column. The memory cells MC in the same row are connected to the same word line WL, and in the same column ends of the memory cells MC are connected between the same bit line BL and the same line/BL.

Figure 11:
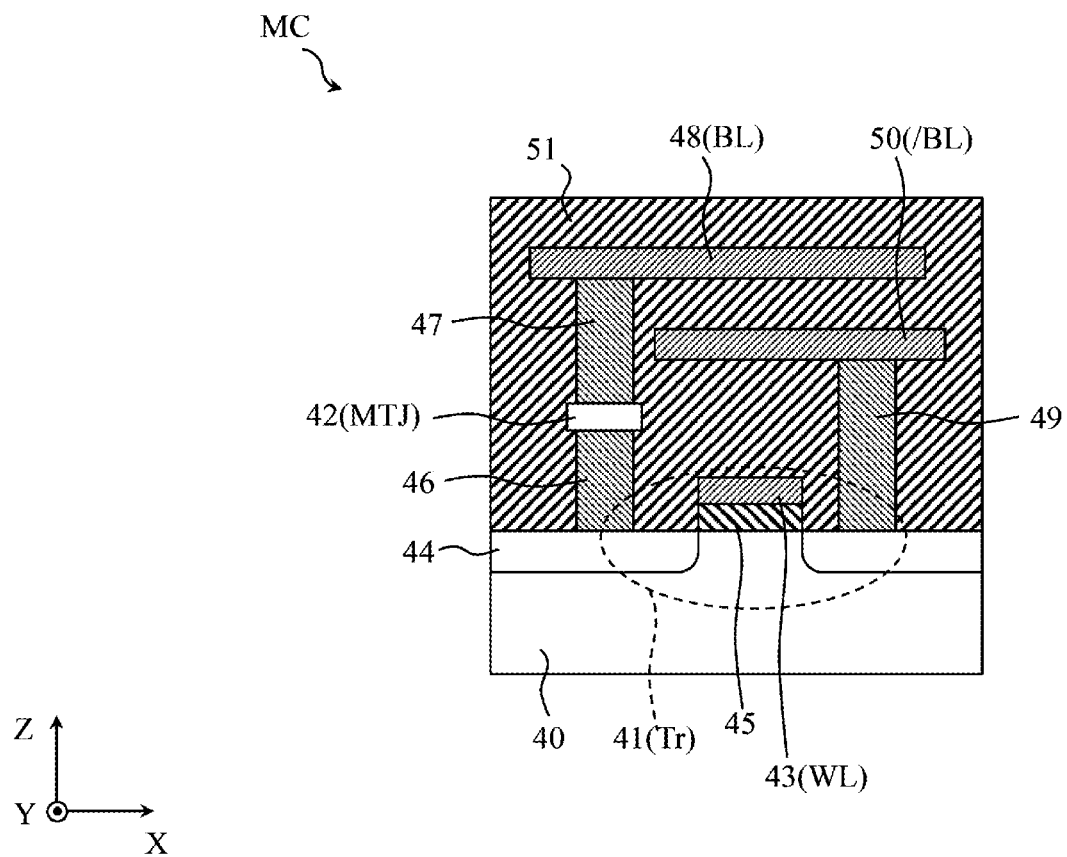
FIG. 11 is a cross-sectional view of a memory cell of a magnetic storage device according to the second modification.

FIG. 11 is a cross-sectional view illustrating a configuration of the memory cell of the magnetic storage device according to the second modification. FIG. 11 corresponds, in general, to the memory cell MC of the first embodiment described with reference to FIG. 3. In addition, in the example of FIG. 11, since the memory cells MC are not stacked on the semiconductor substrate, the suffixes such as "u" and "d" are not used.

As illustrated in FIG. 11, each memory cell MC is provided on a semiconductor substrate 40 and includes a select transistor 41 (Tr) and a magnetoresistive effect element 42 (MTJ). The select transistor 41 is provided as a switch that controls the supply of current during writing and reading of data to and from the magnetoresistive effect element 42. A configuration of the magnetoresistive effect element 42 is equivalent, in general, to FIG. 3 of the first embodiment or FIG. 9 of the first modification.

The select transistor 41 includes a gate (conductor) 43 functioning as a word line WL and a pair of source/drain areas (diffusion areas) 44 provided on the semiconductor substrate 40 at the ends of the gate in the X direction. The gate 43 is provided on an insulator 45, functioning as a gate insulating film, provided on the semiconductor substrate 40. For example, the gate 43 extends in the y direction and is connected in common to gates of select transistors of other memory cells MC provided side by side in the y direction. Gates (conductors) 43 are provided side by side, for example, in the X direction. A contact 46 is provided on the diffusion area 44 at a first end of the select transistor 41. The contact 46 is connected to the lower surface of the magnetoresistive effect element 42. A contact 47 is provided on the upper surface of the magnetoresistive effect element 42, and a conductor 48, functioning as a bit line BL, is connected to the upper surface of the contact 47. For example, the conductor 48 extends in the X direction and is connected in common to upper surfaces of magnetoresistive effect elements of other memory cells provided side by side in the X direction. A contact 49 is provided on the diffusion area 44 provided at a second end of the select transistor 41. The contact 49 is connected to the lower surface of a conductor 50, functioning as the line/BL. For example, the conductor 50 extends in the X direction, and is connected in common to second ends of select transistors of other memory cells provided side by side in the X direction. The conductors 48 and 50 are provided side by side, for example, in the Y direction. The conductor 48 is positioned, for example, above the conductor 50. In addition, although omitted in FIG. 11, the conductors 48 and 50 are disposed to avoid physical and electrical interference therebetween. The select transistor 41, the magnetoresistive effect element 42, the conductors 43, 48 and 50, and the contacts 46, 47 and 49 are embedded in an interlayer insulating film 51. In addition, other magnetoresistive effect elements provided side by side in the X direction or the Y direction with the magnetoresistive effect element 42 are provided, for example, on the same layer. That is, in the memory cell array 10A, a plurality of magnetoresistive effect elements 42 are arranged, for example, in an XY plane.

With the above configuration, the same effect as in the first embodiment may also be achieved in a case where a MOS transistor (a switch between three terminals) is used as the selector SEL instead of a switch between two terminals.

In addition, in the memory cell MC described in the above embodiment and modifications, although a case where the magnetoresistive effect element MTJ is provided below the selector SEL has been described, the magnetoresistive effect element MTJ may be provided above the selector SEL.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A storage device, comprising:
a magnetoresistive effect element including:
a nonmagnetic layer, and
a stacked body on the nonmagnetic layer, the stacked body including:
a first ferromagnetic layer on the nonmagnetic layer;
a second ferromagnetic layer exchange-coupled with the first ferromagnetic layer; and
a magnetic layer between the first ferromagnetic layer and the second ferromagnetic layer, wherein
the magnetic layer is an amorphous material comprising a magnetic material and at least one compound selected from among a carbide, a nitride, and a boride.

2. The storage device according to claim 1, wherein the at least one compound further includes at least one element selected from among titanium, zirconium, hafnium, vanadium, niobium, and tantalum.

3. The storage device according to claim 2, wherein the at least one compound is at least one of titanium nitride, zirconium nitride, titanium carbide, zirconium carbide, niobium carbide, tantalum carbide, titanium boride and zirconium boride.

4. The storage device according to claim 1, wherein the magnetic material includes at least one of cobalt and nickel.

5. The storage device according to claim 1, wherein the magnetic layer is a soft magnetic material.

6. The storage device according to claim 1, wherein the at least one compound is at a concentration of between 5 mol % and 50 mol % in the magnetic layer.

7. The storage device according to claim 1, wherein the second ferromagnetic layer has a crystal structure that is different from a crystal structure of the first ferromagnetic layer.

8. The storage device according to claim 7, wherein the crystal structure of the first ferromagnetic layer is substantially the same as a crystal structure of the nonmagnetic layer.

9. The storage device according to claim 1, wherein
the magnetoresistive effect element further includes a third ferromagnetic layer on a side of the nonmagnetic layer opposite the first ferromagnetic layer, and
the first ferromagnetic layer, the nonmagnetic layer, and the third ferromagnetic layer constitute a magnetic tunnel junction element.

10. The storage device according to claim 9, wherein the third ferromagnetic layer has a thickness greater than a thickness of the stacked body.

11. The storage device according to claim 1, further comprising:
a memory cell comprising the magnetoresistive effect element and a selector connected to the magnetoresistive effect element.

12. A magnetic tunnel junction element, comprising:
a non-magnetic layer having a first crystalline structure;
a first ferromagnetic layer on the non-magnetic layer and having a second crystalline structure corresponding to the first crystalline structure;
a magnetic material layer on the first ferromagnetic layer and having an amorphous structure;

a second ferromagnetic layer on the magnetic material layer and having a third crystalline structure, wherein the first and second ferromagnetic layers are exchange-coupled, and the magnetic material layer includes a magnetic material and at least one compound selected from among a carbide, a nitride, and a boride.

13. The magnetic tunnel junction element according to claim 12, wherein the second crystalline structure is a body-centered-cubic type and the third crystalline structure is a face-center-cubic type.

14. The magnetic tunnel junction element according to claim 12, wherein the magnetic material of the magnetic material layer comprises at least one of cobalt and nickel, the at least one compound is selected from titanium nitride, zirconium nitride, titanium carbide, zirconium carbide, niobium carbide, tantalum carbide, titanium boride and zirconium boride, and the at least one compound is between 5 mol % and 50 mol % in the magnetic material layer.

15. The magnetic tunnel junction element according to claim 12, further comprising:

a third ferromagnetic layer on a side of the non-magnetic layer opposite the first ferromagnetic layer.

16. The magnetic tunnel junction element according to claim 12, wherein the magnetic material of the magnetic layer is a soft magnetic material.

17. The storage device according to claim 1, wherein the first ferromagnetic layer has a crystalline structure corresponding to a crystalline structure of the nonmagnetic layer.

18. The storage device according to claim 1, wherein the first ferromagnetic layer and the second ferromagnetic layer have different crystalline structures.

19. A storage device, comprising:

a magnetoresistive effect element including:

a nonmagnetic layer, and a stacked body on the nonmagnetic layer, the stacked body including:

a first ferromagnetic layer on the nonmagnetic layer, the first ferromagnetic layer being a first crystalline structure;

a second ferromagnetic layer exchange-coupled with the first ferromagnetic layer, the second ferromagnetic layer being a second crystalline structure that differs from the first crystalline structure; and a magnetic layer between the first ferromagnetic layer and the second ferromagnetic layer, wherein the magnetic layer includes a magnetic material and at least one compound selected from among a carbide, a nitride, and a boride.

20. The storage device according to claim 19, wherein the at least one compound is one of titanium nitride, zirconium nitride, titanium carbide, zirconium carbide, niobium carbide, tantalum carbide, titanium boride and zirconium boride, and the magnetic material includes at least one of cobalt and nickel.

* * * * *